US008558196B2

(12) United States Patent
Wieland et al.

(10) Patent No.: US 8,558,196 B2
(45) Date of Patent: *Oct. 15, 2013

(54) CHARGED PARTICLE LITHOGRAPHY SYSTEM WITH APERTURE ARRAY COOLING

(75) Inventors: Marco Jan-Jaco Wieland, Delft (NL); Alexander Hendrik Vincent Van Veen, Rotterdam (NL); Hendrik Jan De Jong, The Hague (NL)

(73) Assignee: Mapper Lithography IP B.V., Delft (NL)

( * ) Notice: Subject to any disclaimer, the term of this patent is extended or adjusted under 35 U.S.C. 154(b) by 41 days.

This patent is subject to a terminal disclaimer.

(21) Appl. No.: 13/295,246

(22) Filed: Nov. 14, 2011

(65) Prior Publication Data

US 2012/0292524 A1 Nov. 22, 2012

Related U.S. Application Data

(60) Provisional application No. 61/413,396, filed on Nov. 13, 2010, provisional application No. 61/415,200, filed on Nov. 18, 2010, provisional application No. 61/421,717, filed on Dec. 10, 2010.

(51) Int. Cl.
*H01J 37/147* (2006.01)
*H01J 37/10* (2006.01)
*G03B 27/26* (2006.01)
*G21K 5/04* (2006.01)

(52) U.S. Cl.
USPC ............... 250/492.22; 250/492.1; 250/492.2; 250/492.3; 250/443.1; 250/396 R; 250/398

(58) Field of Classification Search
USPC ........ 250/492.2, 492.22, 492.1, 492.3, 443.1, 250/396 R, 398
See application file for complete search history.

(56) References Cited

U.S. PATENT DOCUMENTS

| | | | |
|---|---|---|---|
| 6,897,458 B2 | 5/2005 | Wieland et al. | |
| 6,958,804 B2 | 10/2005 | Wieland et al. | |
| 7,084,414 B2 | 8/2006 | Wieland et al. | |

(Continued)

FOREIGN PATENT DOCUMENTS

| | | |
|---|---|---|
| EP | 1746630 B1 | 2/2009 |
| GB | 2351567 A | 1/2001 |
| JP | 2006140267 A2 | 6/2006 |
| WO | 2010109647 A1 | 9/2010 |

*Primary Examiner* — Nikita Wells
(74) *Attorney, Agent, or Firm* — Hoyng Monegier LLP; David P. Owen; Coraline J. Haitjema

(57) ABSTRACT

A charged particle lithography system for pattern transfer onto a target surface, comprising a beam generator for generating a plurality of beamlets, and a plurality of aperture array elements comprising a first aperture array, a blanker array, a beam stop array, and a projection lens array. Each aperture array element comprises a plurality of apertures arranged in a plurality of groups, wherein the aperture groups of each aperture array element form beam areas distinct and separate from non-beam areas formed between the beam areas and containing no apertures for beamlet passage. The beam areas are aligned to form beam shafts, each comprising a plurality of beamlets, and the non-beam areas are aligned to form non-beam shafts not having beamlets present therein. The first aperture array element is provided with cooling channels in the non-beam areas for transmission of a cooling medium for cooling the array element.

32 Claims, 10 Drawing Sheets

(56) References Cited

U.S. PATENT DOCUMENTS

| | | |
|---|---|---|
| 7,129,502 B2 | 10/2006 | Kruit |
| 7,781,748 B2 * | 8/2010 | Platzgummer ............ 250/492.22 |
| 2012/0145915 A1 * | 6/2012 | Van Veen et al. ......... 250/396 R |
| 2012/0292491 A1 * | 11/2012 | Wieland et al. ............... 250/215 |
| 2012/0293780 A1 * | 11/2012 | Dinu-Gurtler et al. ......... 355/30 |

\* cited by examiner

CHARGED PARTICLE LITHOGRAPHY SYSTEM WITH APERTURE ARRAY COOLING

BACKGROUND OF THE INVENTION

1. Field of the Invention

The present invention relates to a charged particle lithography apparatus, and in particular to an aperture array for a lithography system with a cooling system.

2. Description of the Related Art

Currently, most commercial lithography systems use a light beam and mask as a means to reproduce pattern data for exposing a target, such as a wafer with a coating of resist. In a maskless lithography system, beams of charged particles are used to write the pattern data onto the target. The beamlets are individually controlled, for example by individually switching them on and off, to generate the required pattern. For high resolution lithography systems designed to operate at a commercially acceptable throughput, the size, complexity, and cost of such systems becomes an obstacle.

Furthermore, existing charged particle beam technology is suitable for lithography systems for relatively course patterning of images, for example to achieve critical dimensions of 90 nm and higher. However, a growing need exists for improved performance. It is desired to achieve considerably smaller critical dimensions, for example 22 nm, while maintaining sufficient wafer throughput, e.g. between 10 and 100 wafers per hour. In order to achieve such a large throughput at ever decreasing feature sizes it is necessary to increase the number of beams generated by the system, increase the current in the charged particle beams, and reduce the distance between the beams.

The charged particle beams may be produced by collimating a single beam and generating multiple beams from the collimated beam using an aperture array having a plurality of apertures. The charged particle beams impinging on the aperture array will cause a significant heat load in the aperture array, and cause deformation of the aperture array. This deformation results in changing the dimensions of the aperture array due to expansion of the material from which the aperture array is constructed. This alters the spacing and alignment of the apertures which produce the separate charged particle beams, and unless corrected, will result in errors when writing the pattern onto the target.

BRIEF SUMMARY OF THE INVENTION

The present invention seeks to address this problem by providing a charged particle lithography system for transferring a pattern onto the surface of a target. The system comprises a beam generator for generating a plurality of charged particle beamlets, the plurality of beamlets defining a column, and a plurality of aperture array elements comprising a first aperture array, a blanker array, a beam stop array, and a projection lens array. Each aperture array element comprises a plurality of apertures arranged in a plurality of groups, the apertures for letting the beamlets pass through the aperture array element, wherein the groups of apertures of each aperture array element form beam areas distinct and separate from a plurality of non-beam areas formed between the beam areas and containing no apertures for passage of the beamlets, and wherein the beam areas of the aperture array elements are aligned to form beam shafts, each comprising a plurality of beamlets, and the non-beam areas of the aperture array elements are aligned to form non-beam shafts not having beamlets present therein. The first aperture array element is provided with cooling channels adapted for transmission of a cooling medium for cooling the first aperture array element, the cooling channels being provided in the non-beam areas of the first aperture array element.

The first aperture array element may comprise a plate having a thickness in a direction of the axis of the column and a width in a direction perpendicular to the axis of the column, and the apertures may be formed through the thickness of the plate in the non-beam areas of the plate, and the cooling channels formed internally in the non-beam areas of the plate and extending in a direction of the width of the plate. The first aperture array element may comprise a plate having a thickness in a direction of the axis of the column and a width in a direction perpendicular to the axis of the column, wherein the apertures are formed through the thickness of the plate in the non-beam areas of the plate, and the cooling channels are formed in external elements attached to the plate in the non-beam areas and extending in a direction of the width of the plate, the cooling channels adapted for providing structural support for the first aperture array element.

The cooling medium may comprise water. The system may further comprise a coolant system for flowing the cooling medium through the cooling channels, the coolant system being adapted to produce turbulent flow of the cooling medium through the cooling channels.

The first aperture array may be made from a monolithic plate of material in which the apertures and cooling channels are formed. The first aperture array is made from a plate of Tungsten, or a plate of Copper or Molybdenum.

The plurality of aperture array elements further comprise a current limiting aperture array and a condenser lens array, each comprising a plurality of apertures arranged in a plurality of groups, the apertures for letting the beamlets pass through the aperture array elements, and wherein the groups of apertures of each aperture array element form beam areas distinct and separate from a plurality of non-beam areas formed between the beam areas and containing no apertures for passage of the beamlets, and wherein the beam areas of the aperture array elements are aligned to form beam shafts, each comprising a plurality of beamlets, and the non-beam areas of the aperture array elements are aligned to form non-beam shafts not having beamlets present therein. The first aperture array element may comprise an integral current limiting aperture array, the apertures of the first aperture array element having a narrowest portion recessed below the upper surface of the first aperture array element.

The first aperture array element may be provided with a curved upper surface facing towards the beam generator. The first aperture array element may be subdivided into alternating aperture-free areas and aperture areas, each aperture area comprising a plurality of apertures, and wherein the curved upper surface encompasses a plurality of the aperture-free areas and aperture areas. The curved upper surface of the first aperture array element may form a raised dome-shaped area protruding above the upper surface towards the beam generator, or may form a dome-shaped depression in the upper surface area facing the beam generator. The system may have an optical axis and the curved surface may be shaped according to a cosine function centred around the optical axis. The circumference of the curved surface may be substantially larger than the height of the curved surface.

In another aspect, the invention comprises an aperture array element adapted for use in a charged particle lithography system for generating a plurality of beamlets for transferring a pattern onto the surface of a target, the aperture array comprising a plurality of apertures arranged in a plurality of groups, the apertures for letting the beamlets pass through the aperture array element. The groups of apertures form beam areas distinct and separate from a plurality of non-beam areas formed between the beam areas and containing no apertures for passage of the beamlets, and the first aperture array element is provided with cooling channels adapted for transmission of a cooling medium for cooling the first aperture array element, the cooling channels being provided in the non-beam areas of the first aperture array element. The first aperture array element may comprise any of the features described above for the aperture array element of the lithography system.

In yet another aspect, the invention comprises a charged particle beam generator, comprising a charged particle source adapted for generating a diverging charged particle beam, a collimating system for refracting the diverging charged particle beam, the collimating system comprising a first electrode, and an aperture array element forming a second electrode. The system is adapted for creating an accelerating electric field between the first electrode and the second electrode. The first aperture array element of the charged particle beam generator may comprise any of the features described above for the aperture array element of the lithography system.

BRIEF DESCRIPTION OF THE DRAWINGS

Various aspects of the invention and certain examples of embodiments of the invention are illustrated in the drawings in which.

DESCRIPTION OF ILLUSTRATIVE EMBODIMENTS

The following is a description of various embodiments of the invention, given by way of example only and with reference to the figures. The figures are not drawn to scale and merely intended for illustrative purposes.

Figure 1:
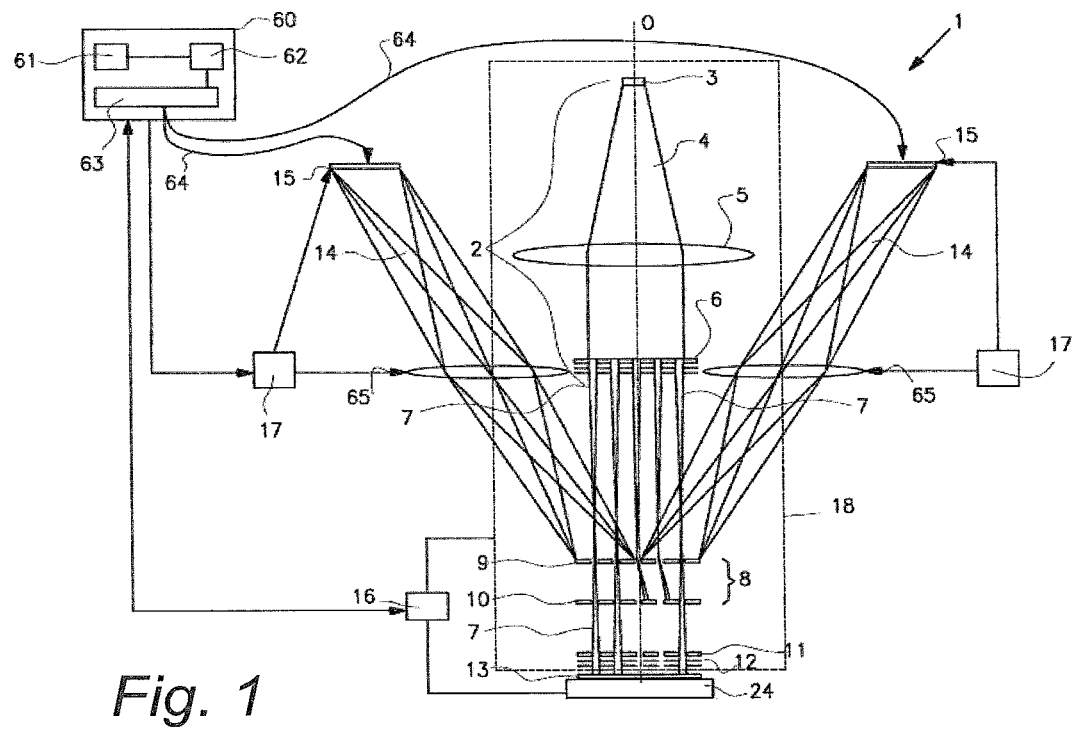
FIG. 1 is a simplified schematic diagram of an embodiment of a charged particle multi-beamlet lithography system.

FIG. 1 shows a simplified schematic drawing of an embodiment of a charged particle multi-beamlet lithography system 1. Such lithography system is for example described in U.S. Pat. Nos. 6,897,458 and 6,958,804 and 7,084,414 and 7,129,502, which are assigned to the applicant of the present application and which are hereby incorporated by reference in their entirety.

Such lithography system 1 suitably comprises a beamlet generator generating a plurality of beamlets, a beamlet modulator patterning the beamlets to form modulated beamlets, and a beamlet projector for projecting the modulated beamlets onto a surface of a target. The beamlet generator typically comprises a source and at least one beam splitter. The source in FIG. 1 is an electron source 3 arranged to produce a substantially homogeneous, expanding electron beam 4. The beam energy of the electron beam 4 is preferably maintained relatively low in the range of about 1 to 10 keV. To achieve this, the acceleration voltage is preferably low, and the electron source 3 may be kept at a voltage between about −1 to −10 kV with respect to the target at ground potential, although other settings may also be used.

In FIG. 1, the electron beam 4 from the electron source 3 passes a collimator lens 5 for collimating the electron beam 4. The collimator lens 5 may be any type of collimating optical system. Before collimation, the electron beam 4 may pass a double octopole (not shown). Subsequently, the electron beam 4 impinges on a beam splitter, in the embodiment of FIG. 1, a first aperture array 6 (although it is possible there are other aperture arrays before array 6). The first aperture array 6 preferably comprises a plate having through-holes. The aperture array 6 is arranged to block part of the beam 4. Additionally, the array 6 allows a plurality of beamlets 7 to pass through so as to produce a plurality of parallel electron beamlets 7.

The lithography system 1 of FIG. 1 generates a large number of beamlets 7, preferably about 10,000 to 1,000,000 beamlets, although it is of course possible that more or less beamlets are generated. Note that other known methods may also be used to generate collimated beamlets. A second aperture array may be added in the system, so as to create subbeams from the electron beam 4 and to create electron beamlets 7 from the subbeam. This allows for manipulation of the subbeams further downstream, which turns out beneficial for the system operation, particularly when the number of beamlets in the system is 5,000 or more.

The beamlet modulator, denoted in FIG. 1 as modulation system 8, typically comprises a beamlet blanker array 9 comprising an arrangement of a plurality of blankers, and a beamlet stop array 10. The blankers are capable of deflecting one or more of the electron beamlets 7. In embodiments of the invention, the blankers are more specifically electrostatic deflectors provided with a first electrode, a second electrode and an aperture. The electrodes are then located on opposing sides of the aperture for generating an electric field across the aperture. Generally, the second electrode is a ground electrode, i.e. an electrode connected to ground potential.

To focus the electron beamlets 7 within the plane of the blanker array 9 the lithography system may further comprise a condenser lens array (not shown).

In the embodiment of FIG. 1, the beamlet stop array 10 comprises an array of apertures for allowing beamlets to pass through. The beamlet stop array 10, in its basic form, comprises a substrate provided with through-holes, typically round holes although other shapes may also be used. In some embodiments, the substrate of the beamlet stop array 10 is formed from a silicon wafer with a regularly spaced array of through-holes, and may be coated with a surface layer of a metal to prevent surface charging. In some further embodiments, the metal is of a type that does not form a native-oxide skin, such as CrMo.

The beamlet blanker array 9 and the beamlet stop array 10 operate together to block or let pass the beamlets 7. In some embodiments, the apertures of the beamlet stop array 10 are aligned with the apertures of the electrostatic deflectors in the beamlet blanker array 9. If beamlet blanker array 9 deflects a beamlet, it will not pass through the corresponding aperture in the beamlet stop array 10. Instead the beamlet will be blocked by the substrate of beamlet block array 10. If beamlet blanker array 9 does not deflect a beamlet, the beamlet will pass through the corresponding aperture in the beamlet stop array 10. In some alternative embodiments, cooperation between the beamlet blanker array 9 and the beamlet stop array 10 is such that deflection of a beamlet by a deflector in the blanker array 9 results in passage of the beamlet through the corresponding aperture in the beamlet stop array 10, while non-deflection results in blockage by the substrate of the beamlet stop array 10.

The modulation system 8 is arranged to add a pattern to the beamlets 7 on the basis of input provided by a control unit 60. The control unit 60 may comprise a data storage unit 61, a read out unit 62 and data converter 63. The control unit 60 may be located remote from the rest of the system, for instance outside the inner part of a clean room. Using optical fibers 64, modulated light beams 14 holding pattern data may be transmitted to a projector 65 which projects light from the ends of fibers within a fiber array (schematically depicted as plate 15) into the electron optical portion of the lithography system 1, schematically denoted by the dashed box and reference number 18.

In the embodiment of FIG. 1, the modulated light beams are projected on to the beamlet blanker array 9. More particularly, the modulated light beams 14 from optical fiber ends are projected on corresponding light sensitive elements located on the beamlet blanker array 9. The light sensitive elements may be arranged to convert the light signal into a different type of signal, for example an electric signal. A modulated light beam 14 carries a portion of the pattern data for controlling one or more blankers that are coupled to a corresponding light sensitive element. Suitably, in order to project the light beams 14 onto corresponding light sensitive elements optical elements such as a projector 65 may be used. Additionally, to allow projection of the light beams 14 at a suitable incident angle, a mirror may be included, for example suitably placed between a projector 65 and the beamlet blanker array 9.

The projector 65 may be appropriately aligned with the plate 15 by a projector positioning device 17 under control of the control unit 60. As a result, the distance between the projector 65 and the light sensitive elements within the beamlet blanker array 9 may vary as well.

In some embodiments, the light beams may, at least partially, be transferred from the plate towards the light sensitive elements by means of an optical waveguide. The optical waveguide may guide the light to a position very close to the light sensitive elements, suitably less than a centimeter, preferably in the order of a millimeter away. A short distance between an optical waveguide and a corresponding light sensitive elements reduces light loss. On the other hand, the use of plate 15 and a projector 65 located away from the space that may be occupied by the charged particle beamlets has the advantage that the beamlet disturbance is minimized, and the construction of the beamlet blanker array 9 is less complex.

The modulated beamlets coming out of the beamlet modulator are projected as a spot onto a target surface 13 of a target 24 by the beamlet projector. The beamlet projector typically comprises a scanning deflector for scanning the modulated beamlets over the target surface 13 and a projection lens system for focusing the modulated beamlets onto the target surface 13. These components may be present within a single end module.

Such end module is preferably constructed as an insertable, replaceable unit. The end module may thus comprise a deflector array 11, and a projection lens arrangement 12. The insertable, replaceable unit may also include the beamlet stop array 10 as discussed above with reference to the beamlet modulator. After leaving the end module, the beamlets 7 impinge on a target surface 13 positioned at a target plane. For lithography applications, the target usually comprises a wafer provided with a charged-particle sensitive layer or resist layer.

The deflector array 11 may take the form of a scanning deflector array arranged to deflect each beamlet 7 that passed the beamlet stop array 10. The deflector array 11 may comprise a plurality of electrostatic deflectors enabling the application of relatively small driving voltages. Although the deflector array 11 is drawn upstream of the projection lens arrangement 12, the deflector array 11 may also be positioned between the projection lens arrangement 12 and the target surface 13.

The projection lens arrangement 12 is arranged to focus the beamlets 7, before or after deflection by the deflector array 11. Preferably, the focusing results a geometric spot size of about 10 to 30 nanometers in diameter. In such preferred embodiment, the projection lens arrangement 12 is preferably arranged to provide a demagnification of about 100 to 500 times, most preferably as large as possible, e.g. in the range 300 to 500 times. In this preferred embodiment, the projection lens arrangement 12 may be advantageously located close to the target surface 13.

In some embodiments, a beam projector may be located between the target surface 13 and the projection lens arrangement 12. The beam protector may be a foil or a plate provided with a plurality of suitably positioned apertures. The beam protector is arranged to absorb the released resist particles before they can reach any of the sensitive elements in the lithography system 1.

The projection lens arrangement 12 may thus ensure that the spot size of a single pixel on the target surface 13 is correct, while the deflector array 11 may ensure by appropriate scanning operations that the position of a pixel on the target surface 13 is correct on a microscale. Particularly, the operation of the deflector array 11 is such that a pixel fits into a grid of pixels which ultimately constitutes the pattern on the target surface 13. It will be understood that the macroscale positioning of the pixel on the target surface 13 is suitably enabled by a wafer positioning system present below the target 24.

Commonly, the target surface 13 comprises a resist film on top of a substrate. Portions of the resist film will be chemically modified by application of the beamlets of charged particles, i.e. electrons. As a result thereof, the irradiated portion of the film will be more or less soluble in a developer, resulting in a resist pattern on a wafer. The resist pattern on the wafer can subsequently be transferred to an underlying layer, i.e. by implementation, etching and/or deposition steps as known in the art of semiconductor manufacturing. Evidently, if the irradiation is not uniform, the resist may not be developed in a uniform manner, leading to mistakes in the pattern. High-quality projection is therefore relevant to obtain a lithography system that provides a reproducible result. No difference in irradiation ought to result from deflection steps.

Figure 2:
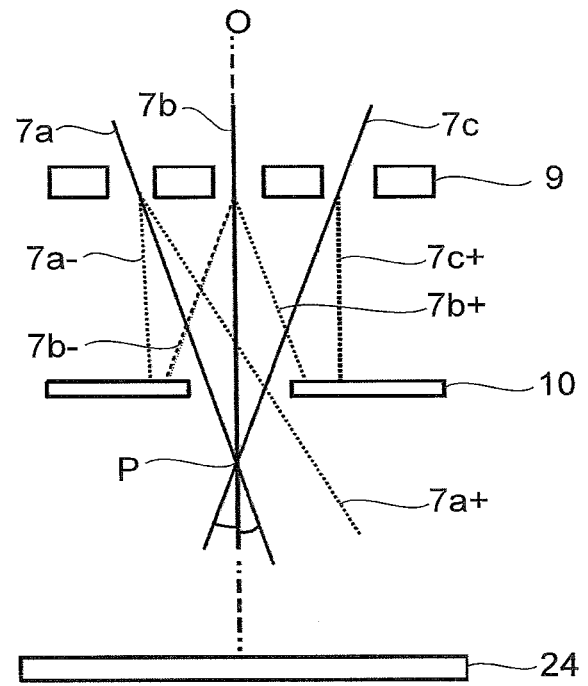
FIG. 2 is a schematic diagram showing operation of an embodiment of the beamlet blanker array in the lithography system of FIG. 1.

FIG. 2 schematically shows the operation of an embodiment of the beamlet blanker array 9 in the lithography system of FIG. 1. In particular, FIG. 2 schematically shows a cross-sectional view of a portion of a beamlet modulator comprising a beamlet blanker array 9 and beamlet stop array 10. The beamlet blanker array 9 is provided with a plurality of apertures 35. For sake of reference the target 24 has also been indicated. The figure is not drawn to scale.

The shown portion of the beamlet modulator is arranged to modulate three beamlets 7a, 7b, and 7c. The beamlets 7a, 7b, 7c may form part of a single group of beamlets that may be generated from a beam originating from a single source or from a single subbeam. The beamlet modulator of FIG. 2 is arranged for converging groups of beamlets towards a common point of convergence P for each group. This common point of convergence P is preferably located on an optical axis O for the group of beamlets.

Figure 3A:
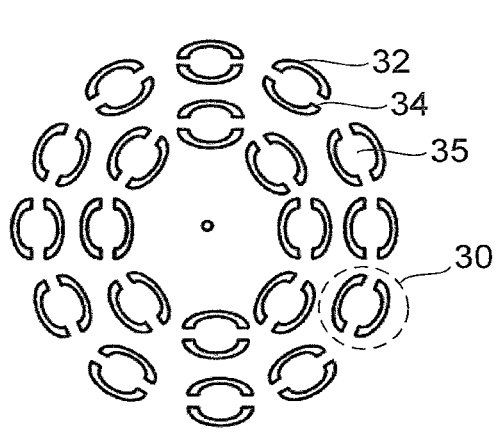
FIGS. 3A and 3B are schematic diagrams of arrangements of electrodes within a beamlet blanker array.

FIG. 3A schematically shows a top view of an arrangement of electrodes within a beamlet blanker array wherein the beamlet blanker array is arranged to converge groups of beamlets towards a common point of convergence. In this embodiment the beamlet blankers take the form of electrostatic modulators 30, each modulator 30 comprising a first electrode 32, a second electrode 34, and an aperture 35 extending through the body of the beamlet blanker array. The electrodes 32, 34 are located on opposing sides of the aperture 35 for generating an electric field across the aperture 35. The individual modulators 30 form a radial arrangement around a centrally located optical axis O. In the embodiment shown in FIG. 3A, both electrodes 32, 34 have a concave shape, which makes the shape of the electrodes 32, 34 conform to the cylindrical apertures 35. This cylindrical aperture shape is in itself suitable for preventing the introduction of certain optical aberrations, such as astigmatism.

Figure 3B:
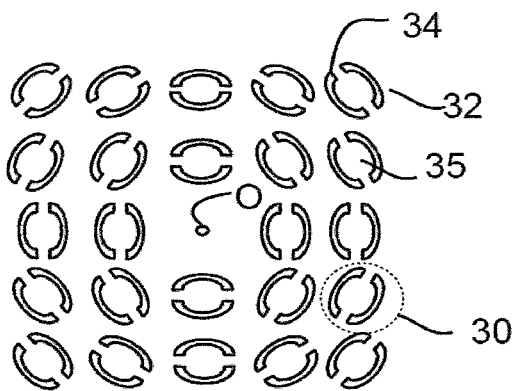

FIG. 3B shows an alternative arrangement of electrodes within a beamlet blanker array wherein the beamlet blanker array is arranged to converge groups of beamlets towards a common point of convergence. In this arrangement the individual modulators 30 do again form a radial arrangement around a centrally located optical axis O. However, the individual modulators 30 are not placed in concentric circles around the optical axis, but in an array formed by columns and rows with orientations substantially perpendicular to each other. Simultaneously, the electrodes 32, 34 of the individual modulators 30 do have an orientation such that they can deflect beamlets along radial lines extending from the optical axis O.

Figure 4:
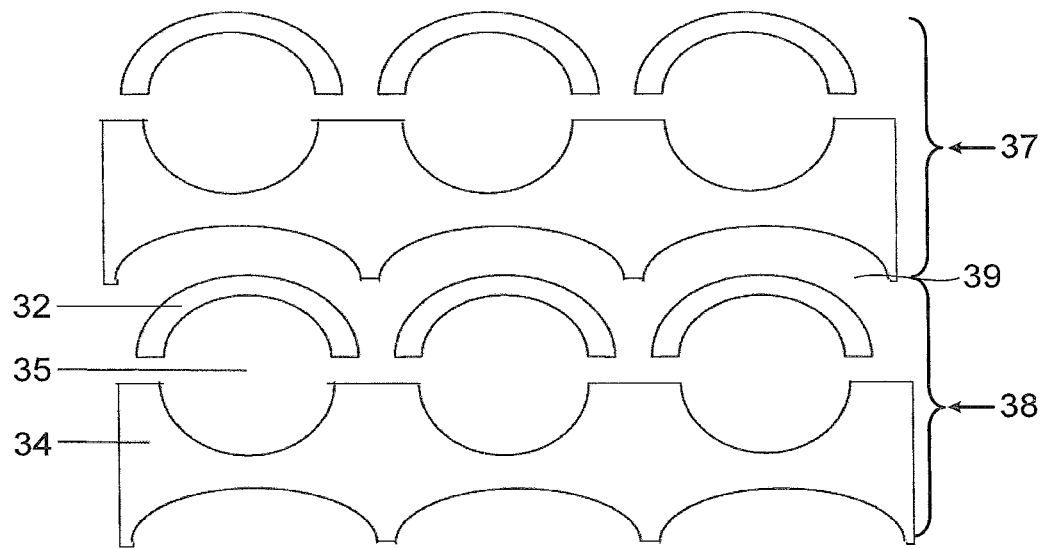
FIG. 4 is a schematic diagram of another embodiment of electrodes within a beamlet blanker array.

FIG. 4 schematically shows a top view of yet another embodiment of electrodes within a beamlet blanker array. In this embodiment, the electrodes 32, 34 are again situated around apertures 35, but the second electrodes 34 of several modulators 30 are integrated into a single strip. The modulators 30 are arranged in rows. An isolation zone 39 is suitably present between a first row 37 of modulators 30 and a second row 38 of modulators 30. The isolation zone 39 is designed to prevent undesired discharge.

Figure 5:
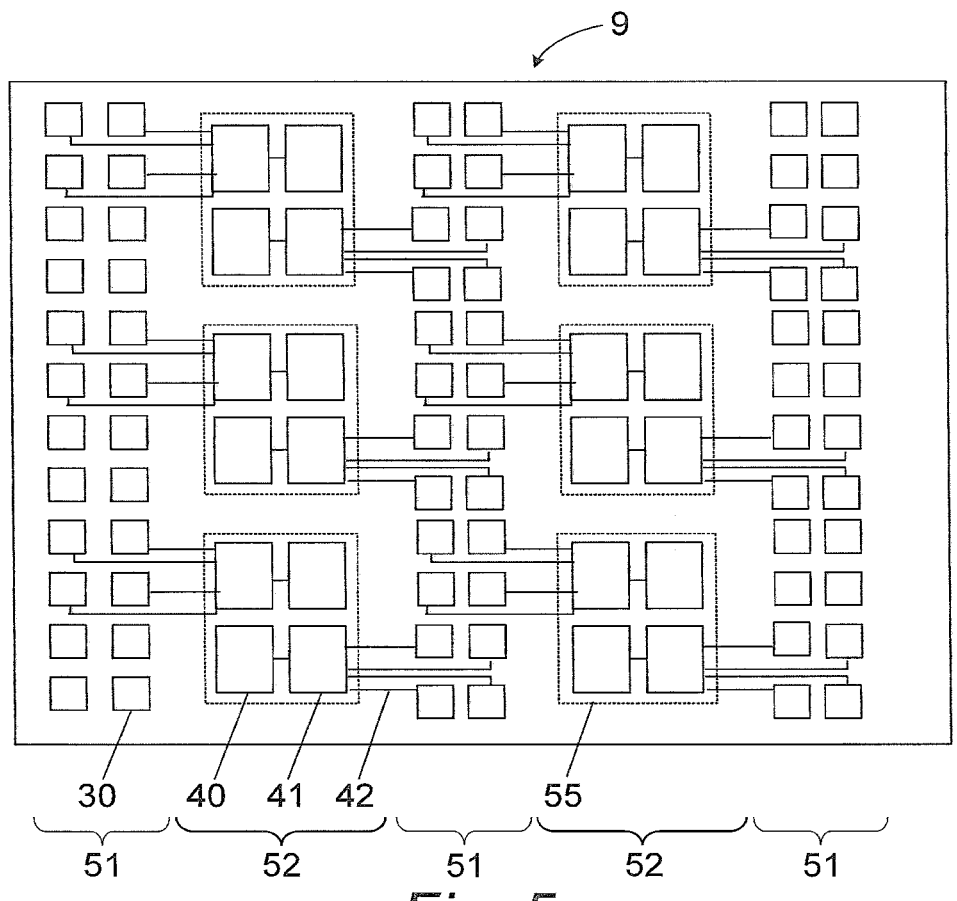
FIG. 5 is a schematic diagram of a topographic arrangement of components for a beamlet blanker array.

FIG. 5 schematically shows a top view of a topographic arrangement of components that may be used in a beamlet blanker array 9 according to embodiments of the invention. The beamlet blanker array is divided into beam areas 51 and non-beam areas 52. The beam areas 51 represent areas arranged to receive and modulate beamlets. The non-beam areas 52 are areas arranged to provide an area for components needed to support the components within the beam areas 51.

Components being present within the beam areas 51 include the modulators 30. The modulators 30 may take the form of electrostatic deflectors as discussed with reference to FIGS. 2-4.

Components within the non-beam areas 52 may include light sensitive elements 40 arranged to receive modulated light signals, for example in a way as discussed with reference to FIG. 1. Suitable examples of light sensitive elements 40 include but are not limited to photodiodes and phototransistors. The non-beam areas in the embodiment shown in FIG. 5 further include demultiplexers 41. The light signals received by the light sensitive elements 40 may be multiplexed signals to include information for more than one modulator 30. Therefore, after reception of the light signal by the light sensitive element 40, the light signal is transferred to a demultiplexer 41 where the signal is demultiplexed. After demultiplexing, the demultiplexed signals are forwarded to the correct modulators 30 via dedicated electrical connections 42.

As a result of the use of multiplexed light signals and an arrangement of light sensitive elements 40 and demultiplexers 41, the number of light sensitive elements 40 is lower than the number of modulators 30. Having a limited number of light sensitive elements 40 enables reduction of the dimensions of the non-beam areas 52. The beam areas 51 may then be placed more closely together to increase the number of modulators 30 per unit area in the blanker array. In comparison to the non-multiplexed embodiment, the lay-out of the beamlet blanker array would then be more compact if the same number of modulators would be used. If the dimensions of the blanker array would remain substantially the same, more modulators could be used. Alternatively, instead of decreasing the size of the non-beam areas 52 the use of the multiplexed embodiment could enable the use of light sensitive elements 40 with a greater light receiving area. The use of a greater light receiving area per light sensitive element 40 reduces the complexity of the optics needed to direct the light signals towards the correct light sensitive element 40 and makes the light receiving structure more robust.

Figure 6:
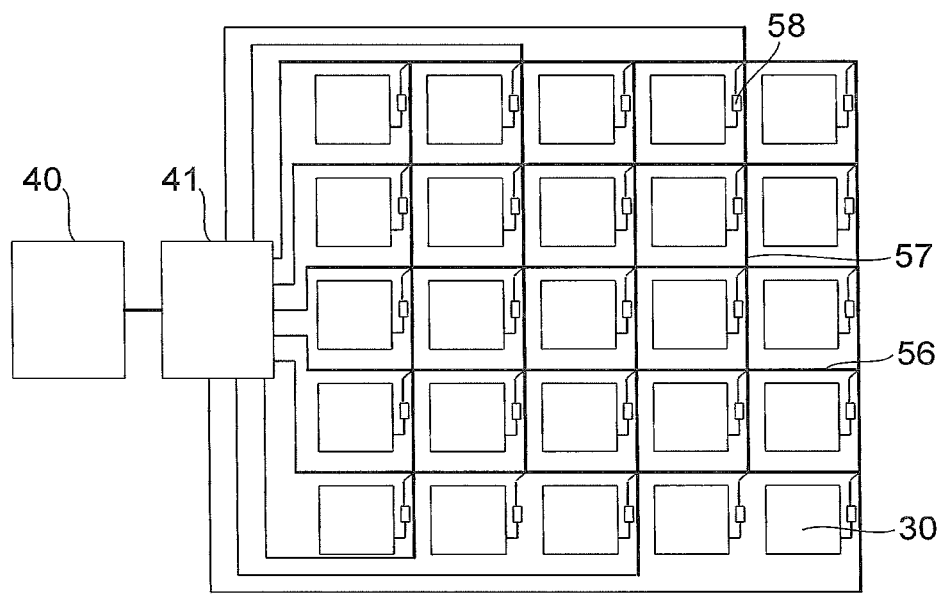
FIG. 6 is a schematic diagram of another topographic arrangement of components for a beamlet blanker array.

The modulators 30 may be suitably arranged in columns and rows to allow addressing via wordlines 56 and bitlines 57 and storage elements 58, as shown in FIG. 6. Such arraywise addressing reduces the number of connections extending from the demultiplexer 41 to the modulators 30. For example, in FIG. 6 only 10 connection lines are present, while individual addressing would result in 25 connection lines to address the 25 modulators 30. Such reduction of connection lines improves the reliability of the beamlet blanker array 9 as it becomes less susceptible to failure due to a malfunctioning connection between a demultiplexer 41 and a modulator 30. Furthermore, the connections may occupy less space if placed in such arraywise addressing arrangement.

Figures 7A, 7B:
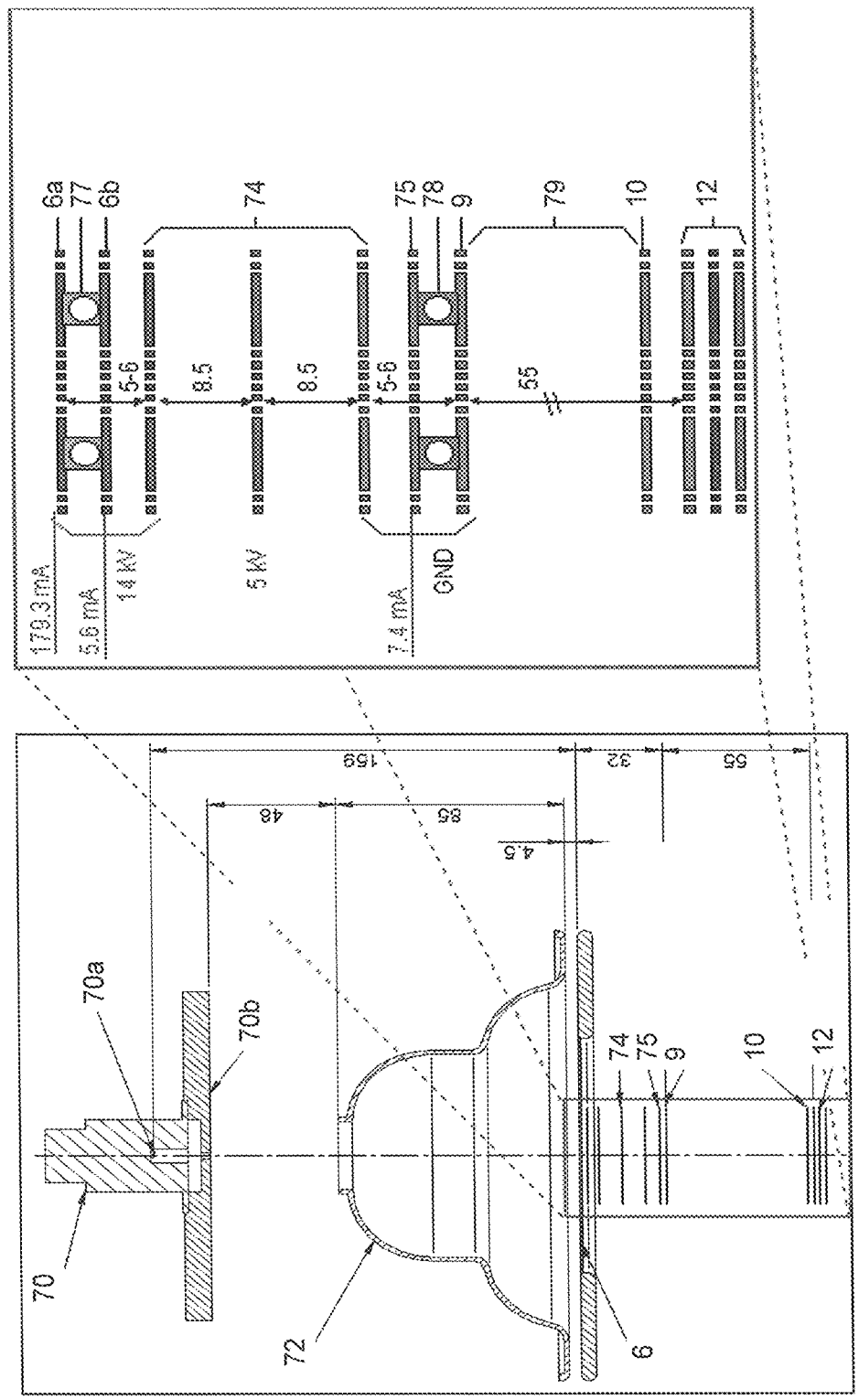
FIGS. 7A and 7B are schematic diagrams of a lithography machine with a column divided into beam and non-beam areas.

FIGS. 7A and 7B are schematic diagrams of a lithography machine with the column divided into beam and non-beam areas, showing more detail of some of the elements of the machine. FIG. 7A shows a charged particle source comprising an electron gun 70 with cathode 70a and gun mounting plate 70b. A collimator electrode 72 and a series of array elements including aperture array 6, condenser lens arrays 74, multi-aperture array 75, beamlet blanker array 9, beam stop array 10, and projection lens arrays 12.

FIG. 7B is an expanded view showing a cross-section through these aperture array elements. In the embodiment shown the first aperture array 6 includes a collimator aperture array 6a and current limiting array 6b. The system also includes three condenser lens arrays 74, a multi-aperture array 75, beamlet blanker array 9, beam stop array 10, and three projection lens arrays 12. Each aperture array element includes beam areas which comprise a large number of apertures through which a corresponding group of beamlets pass on their path from source to target, and non-beam areas in which have no apertures for beamlets. The beam areas comprise distinct and separate areas for conveying and manipulating the beamlets, and the non-beam areas comprise distinct and separate areas dedicated to accommodating components and circuitry for support of the functions of the various aperture array elements.

Figures 8A, 8B:
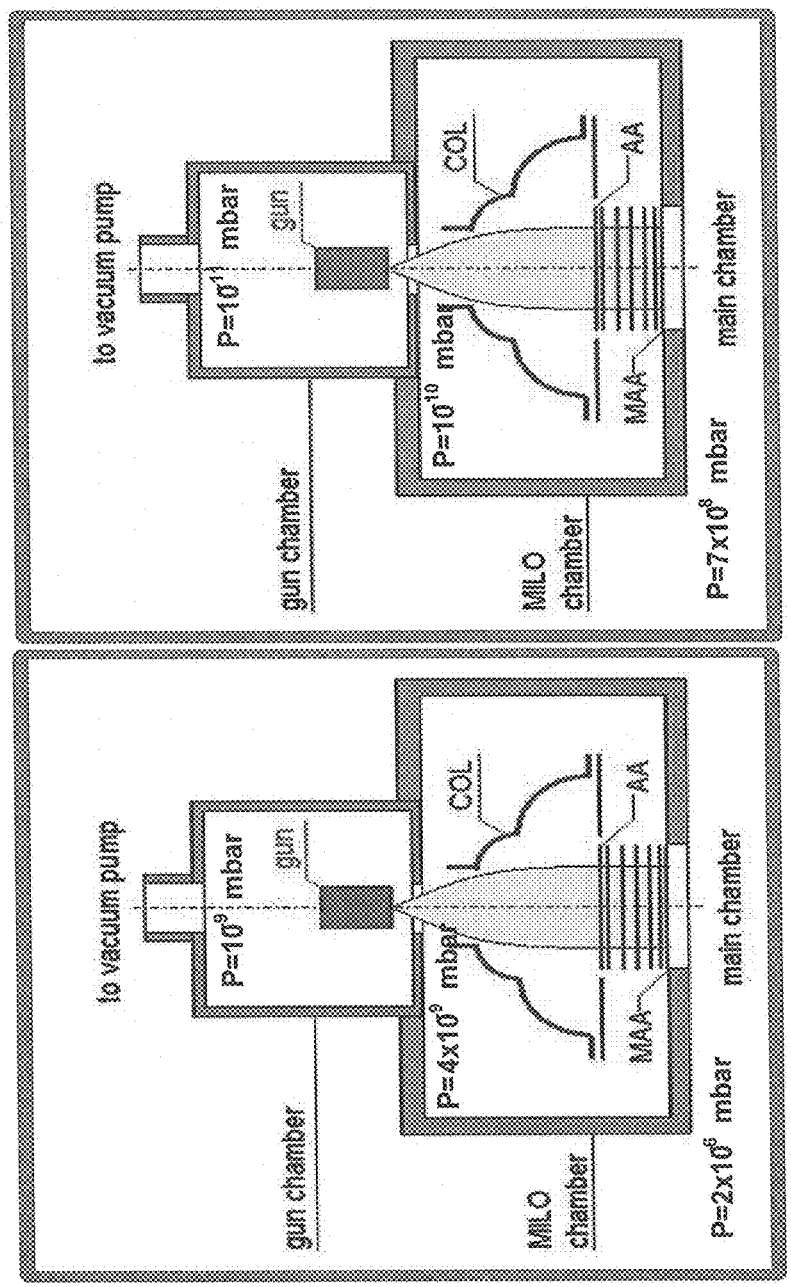
FIGS. 8A and 8B are schematic diagrams of a lithography machine showing aperture array elements in a vacuum chamber.

In the embodiment illustrated in FIG. 7B, the beam areas are located in corresponding vertical locations on the various aperture array elements, so that a vertical column of beamlets pass through the apertures of a single corresponding beam area of each aperture array element along the beamlets' trajectories. In the embodiment shown, there are multiple columns of beamlets, each column comprising substantially parallel beamlets and the different columns of beamlets substantially parallel to each other, and each group of beamlets passing through a single beam area of each aperture array element. In other embodiments, the beamlets within a column may be non-parallel, e.g. converging or diverging, and/or the columns of beamlets may be non-parallel. The non-beam areas are similarly located in corresponding vertical locations on the various aperture array elements. The resulting structure creates vertical shafts within the substantial part of the vertical height of the projection column of the lithography machine, alternating shafts occupied by charged particle beamlets and shafts in which no beamlets are present. The aperture array elements and projection column are usually located in a vacuum chamber, as shown for example schematically in FIGS. 8A and 8B. A number of the aperture array elements are depicted in an intermediate chamber within a main vacuum chamber, or alternatively, the first aperture array element may be located in the intermediate chamber with the remaining aperture array elements below and outside the intermediate vacuum chamber.

In the embodiment of FIG. 7B, the alternating beamlet shafts and non-beamlet shafts begin from the first aperture array element 6a in the projection column. The first aperture array element 6a initially creates the shafts, due to the arrangement of apertures therein. The first aperture array element 6a may be made part of a collimator electrode, or located in close proximity to the collimator electrode, as shown in FIG. 7A. The collimator aperture array element 6a may be integral with a current limiting aperture array 6b having apertures aligned with or part of the apertures of aperture array 6a. These two aperture array elements may be provided with a common set of cooling ducts 77, located in the non-beams areas of the aperture array elements, for passage of a cooling medium such as water as indicated in FIG. 7B. Each aperture array element or integral set of aperture array elements may have their own set of cooling ducts, and the cooling setpoint set at a different temperature level, e.g. being set by flow rate of the cooling medium.

In the projection column of FIGS. 7A and 7B, the column subsequently comprises a condenser lens array 74, comprising in this embodiment a set of three condenser lens electrodes. Downstream from the condenser lens electrodes 74 is a multi-aperture array element 75 and a beamlet modulator or blanker element 9. Further downstream of these elements, with sufficient intervening space 79 to accommodate a light optics system and sensor, a beam stop array 10 is included, and yet further downstream a projection lens assembly 12. Beamlet deflector arrays are omitted from FIGS. 7A and 7B but may be located above or below the beam stop array.

Figure 9:
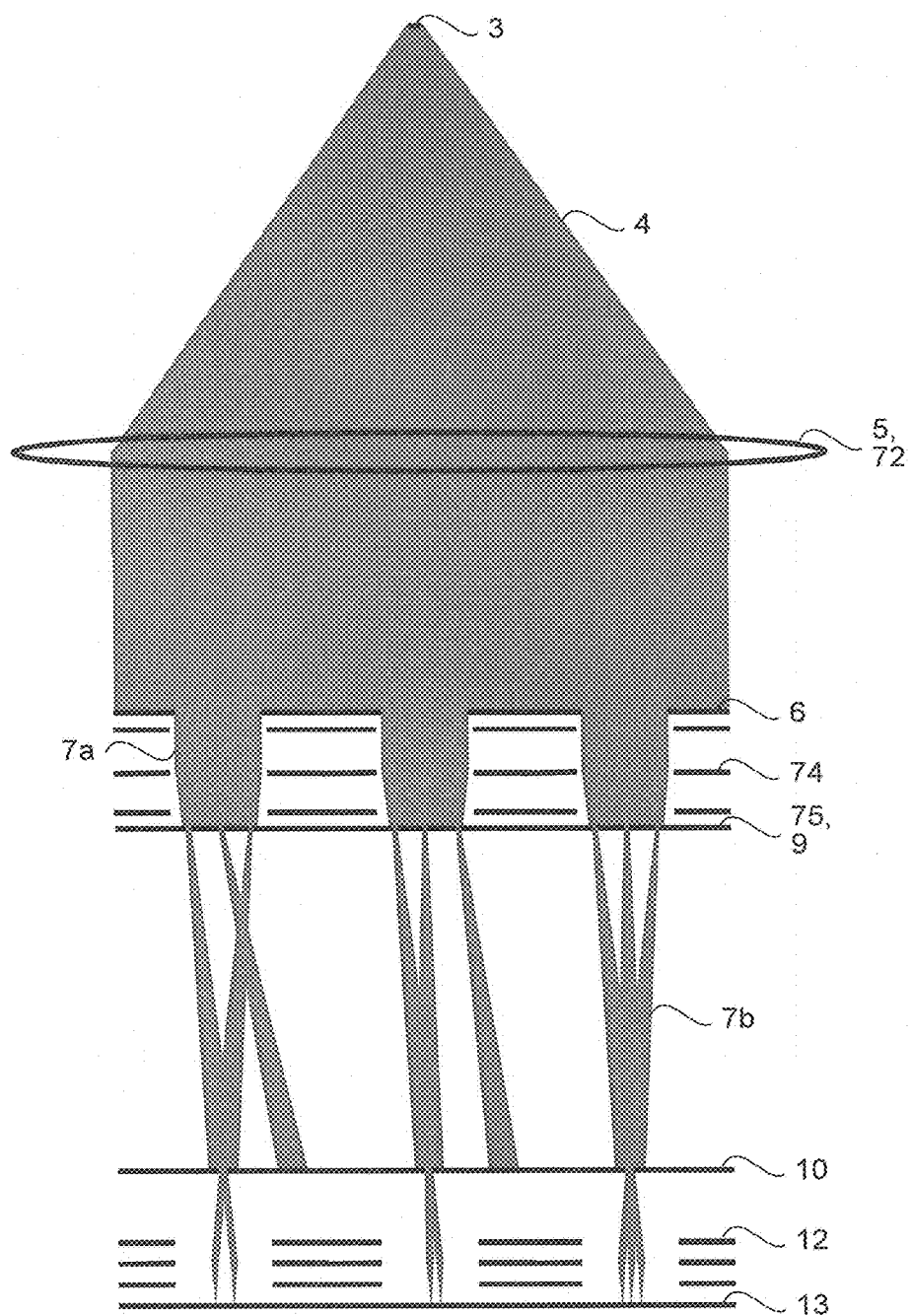
FIG. 9 is a simplified schematic diagram of a lithography machine forming multiple sub-beams and multiple beamlets.

The projection column and hence the system is now improved by having it partially sub-divided in beam and non-beam shafts. A simplified diagram of the projection column from source to target in shown in FIG. 9, showing a lithography machine forming multiple sub-beams 7a (by aperture array 6) and multiple beamlets 7b (by multi-aperture array 75) from each sub-beam, and the sub-beams and beamlets being arranged within the projection column in shafts alternating with non-beam shafts.

Such a division into beam and non-beam shafts at the location of the beamlet blanker element 9 allows for efficient spatial incorporation of light optics, light optics sensors and associated and further required electrical circuitry in the non-beam areas thereof. The light optics may comprise free space light optics, as well as optical fibers, guiding light signals from a pattern streaming system onto the beamlet blanker element, and in particular light sensitive elements located on the blanker element.

The beam and non-beam shafts may extend from the first aperture array element 6 up to the projection lens array element 12. This extent regards both the columns space as well as the elements included therein upstream and downstream. In all cases, especially at the aperture array elements 6a and 6b, multi-aperture array 75 and blanker array 9, and beam stop array 10, the non-beam areas are preferably provided with structural support elements, enhancing rigidity and hence the functional quality of the aperture array elements. As can be seen in FIG. 7B, the support elements may be common to two subsequent aperture array elements of the projection column. The structural element may also be adapted to function as a structural cooling element, e.g. in the form of a cooling duct for a cooling medium. In this respect, at least the first aperture array element 6 of the column, is provided with cooling ducts 77 in the non-beam areas.

Figure 10:
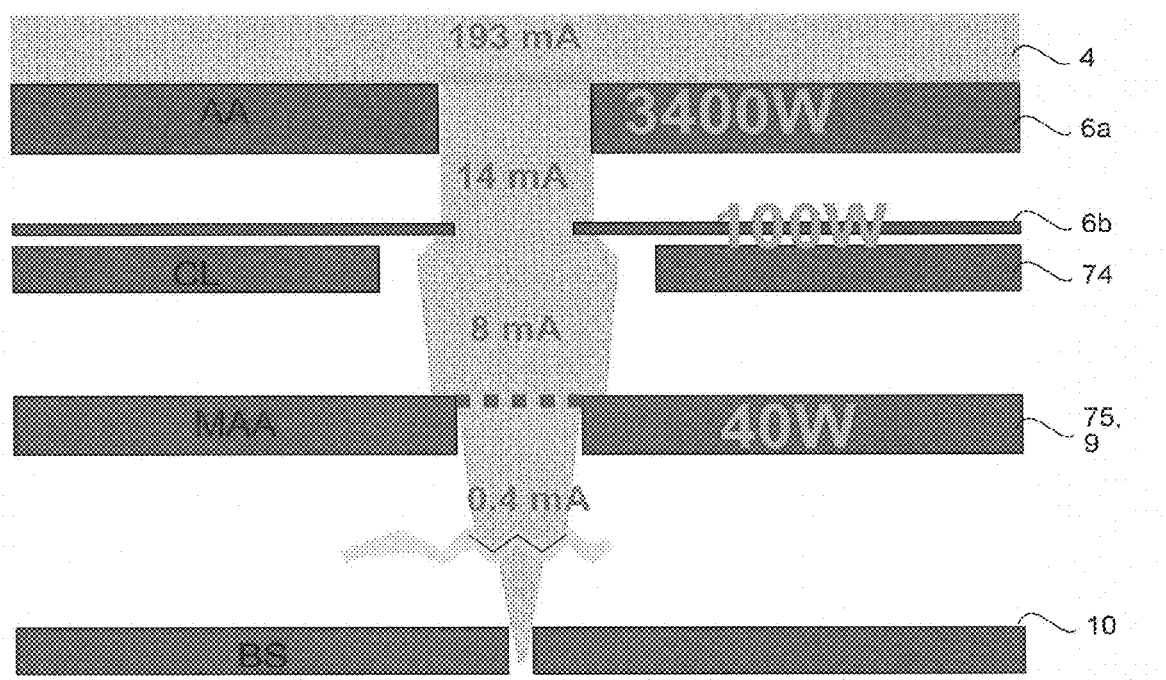
FIG. 10 is a schematic diagram illustrating current and heating effect of aperture array elements in a charged particle lithography system.

FIG. 10 is a diagram illustrating an example of the current and heating effect of a beamlet of a charged particle lithography machine as it passes though various aperture array elements of the projection column. The current levels of the beamlet in milli-Amperes (mA) and power levels in Watts (W) are indicated. The largest amount of power, occurring in the form of heat, will build up at the first aperture array element 6a of the column. Hence, at least the first aperture array element 6a is provided with cooling elements located in the non-beam areas of the element. Downstream of the aperture array element 6a or integrated with it, the column is preferably provided with a second, functionally current limiting aperture array 6b, an aligned aperture array element having apertures smaller in diameter than the aperture array element 6a. The condenser lens elements 5, 74 are provided with apertures of a diameter larger than that of a preceding current limiting aperture array element, and thus are hardly loaded with heat from the beamlets and are not provided with any cooling provision. It may also become evident that the multi aperture array element 75 and blanker array 9 (integrated into a single unit in the embodiment illustrated in FIG. 10) are relatively hardly loaded with heat. However, to improve the quality of the beamlets created by the multi-aperture array element 75, this element and the blanker element 9 may also each be provided with cooling, here in the form of a set of cooling medium ducts, likewise integrated with a stiffness support structure. Preferably the multi aperture array element 75 and the blanker element 9 are provided with a common cooling system. The beam stop array 10 may also be provided with a possibly integrated cooling provision, preferably at the upstream side thereof.

Figure 11:
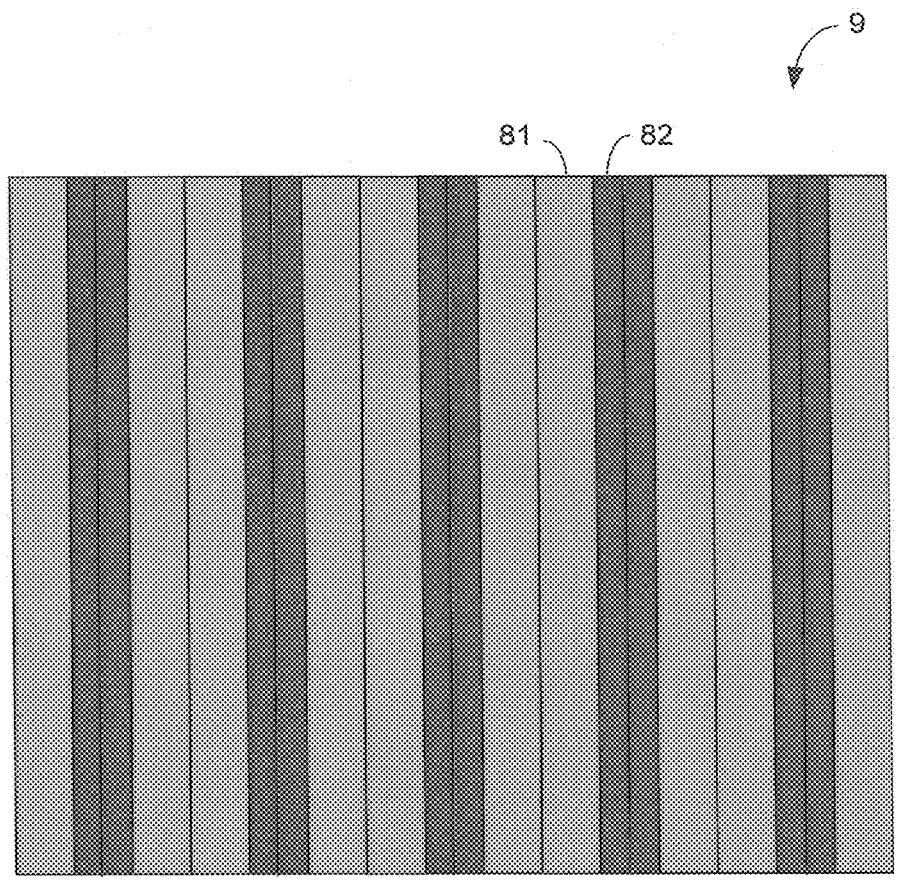
FIG. 11 is a top view of one embodiment of a beamlet blanker element showing beam areas and non-beam areas.

FIG. 11 is a top view of the beamlet blanker element 9 showing beam areas 81 (also referred to as aperture areas) and non-beam areas 82 (also referred to as non-aperture areas). Preferably the beam and non-beam areas are composed as rectangular shaft cross sections, composed of a non-beam area 82 of half the width of that of a beam area 81, typically of 4 mm and 2 mm width. Such sets are included in the system with the non-beam areas or shafts included back-to-back.

Figure 12:
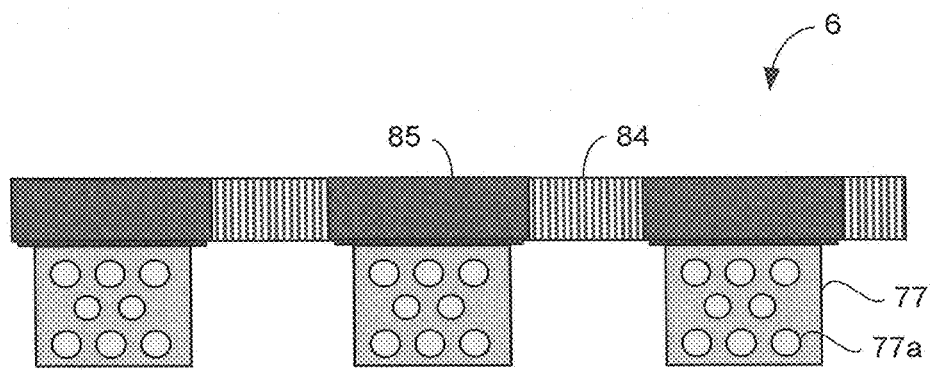
FIG. 12 is a cross-section through an aperture array element with beam and non-beam areas and cooling channels.

FIG. 12 shows a cross-section through an aperture array element showing beam/aperture areas 84 and non-beam/non-aperture areas 85. A cooling duct 77 embodied as a support member comprising multiple internal sub-channels 77a through which a cooling medium flows. Each cooling duct/support member 77 is located in a non-aperture area 85 located between adjacent aperture areas 84.

Figure 13:
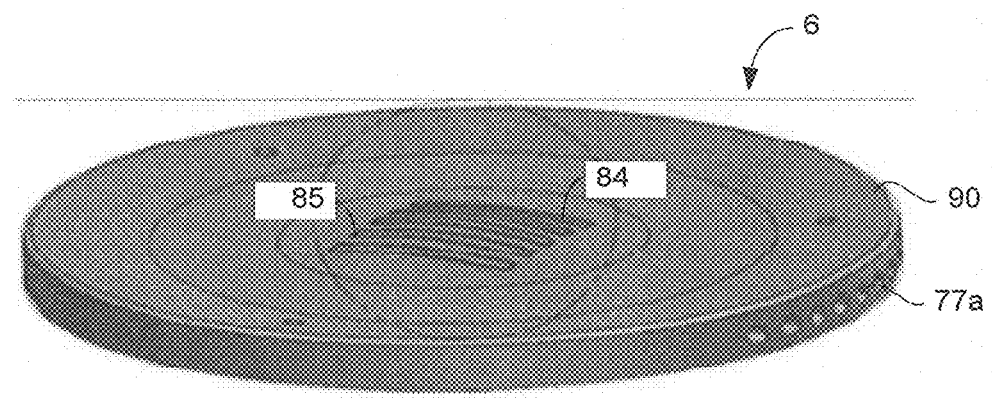
FIGS. 13, 14 and 15 are diagrams of another embodiment of an aperture array element with beam and non-beam areas and cooling channels.
Figure 14:
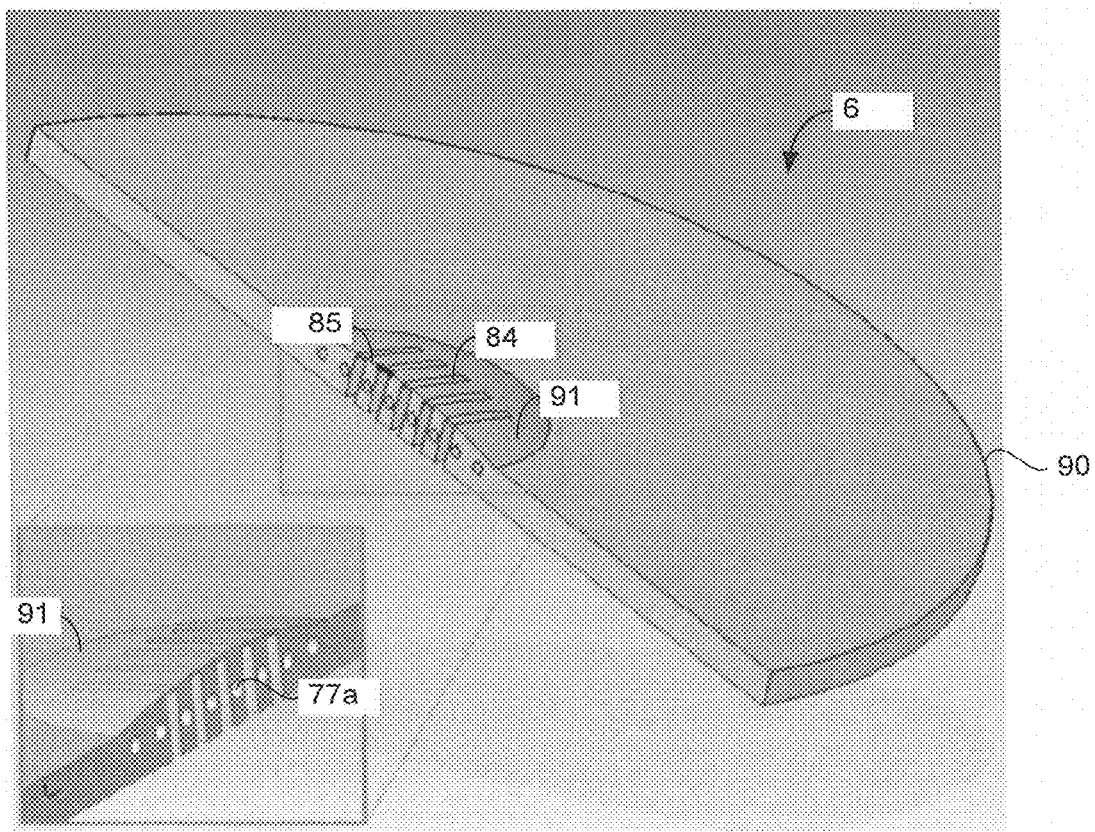
Figure 15:
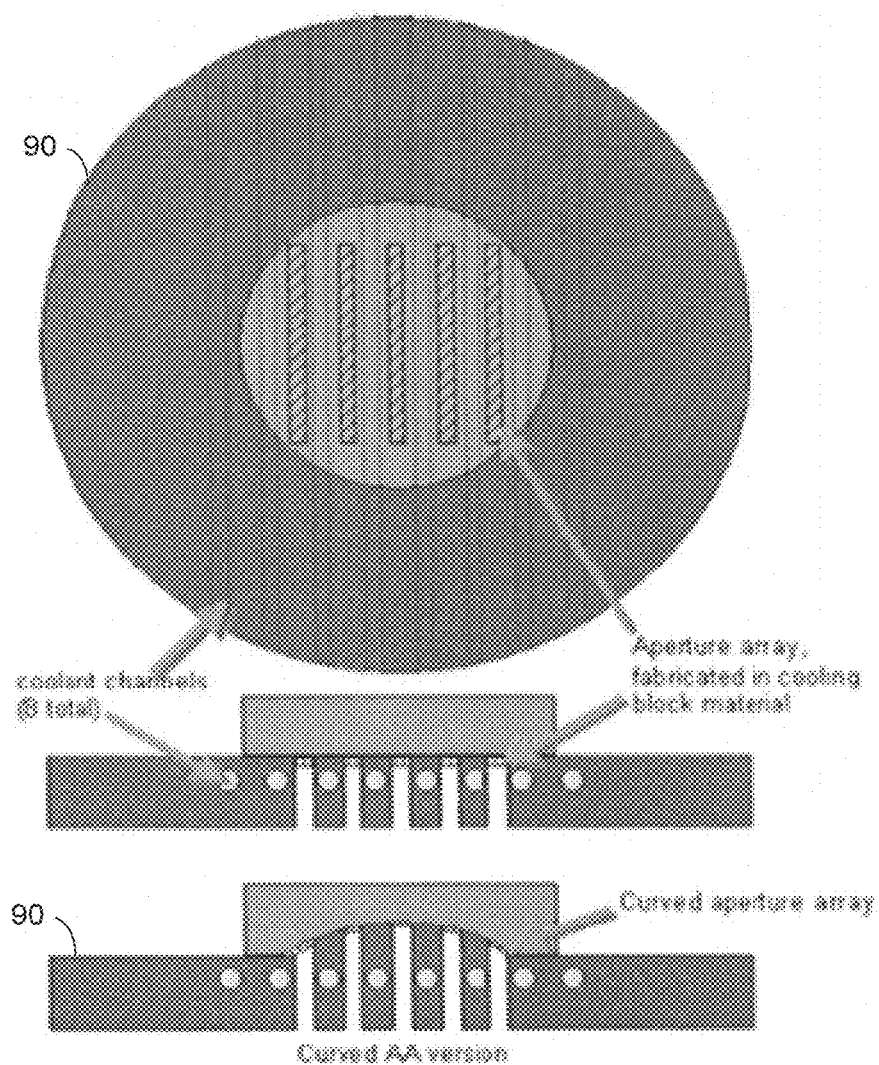

FIGS. 13, 14 and 15 show an embodiment of the aperture array element 6 comprising a monolithic plate 90 with a curved upper surface. This embodiment of the aperture array element 6 may be used in any of the embodiments of the lithography system described herein and with the other array elements described herein, may include a collimator aperture array 6a and current limiting aperture array 6b formed as an integral unit, and may include alternating beam and non-beam areas aligned with and forming shafts are described herein.

The upper surface of the aperture array is curved upwards (in the direction of the charged particle source) in a simple convex shape to form a raised dome-shaped portion 91. The center of the curve may be about 3 mm higher than the edge of the curved section, with a circumference of for example 50 mm. The aperture areas 84 represent areas arranged to receive the charged particle beam and each aperture area 84 comprises a plurality of apertures in the form of through holes. In this embodiment, the aperture areas 84 are rectangular in shape (5 rectangular aperture areas are shown but a different number may be used) to match the rectangular shaped beam areas of the other elements such as the blanker array 9 shown in FIG. 11. The non-aperture areas 85 are areas free of apertures and form rectangular areas between and alternating with the apertures areas 84.

The domed portion of the upper surface of the aperture array may be curved upwards according to a cosine function centred around the optical axis of the system. It was found that this cosine shape provides better beam aberration reduction. The radius of the domed portion 91 is preferably larger than the diameter of the charged particle beam where the beam intersects the surface of the aperture array. In another embodiment, the domed portion 91 may also be formed as a dome-shaped depression in the upper surface of the aperture array.

The plate 90 of the aperture array includes cooling channels 77a formed internally in the plate, through which a cooling medium may flow. The cooling channels extend through the non-aperture areas 85, extending along the length of each non-aperture area.

The cooling medium is preferably water, although other suitable fluids may also be used. The cooling medium is preferably flowed through the channels 77a to provide turbulent flow within the channels. Turbulent flows typically have much higher Nusselt numbers. This is due the fact that turbulent mixing occurs in the boundary layer of the flow, providing enhanced heat transfer from the channel walls in to the interior of the flow. In laminar flow, there is no flow component perpendicular to the channels walls, so any heat transfer in that direction occurs solely via much less efficient conduction in the cooling fluid. Several relations exist to determine the Nusselt number for turbulent flow, but generally the Nusselt number is mainly dependent on the Reynolds number of the flow. For a 3 mm channel and 10 m/s flow speed, Re=30000 for a 20 degrees C. water flow, the associated Nusselt number is 190 and the heat transfer coefficient is fluid-wall temperature difference is an acceptable 40K. This estimate shows that turbulent convective heat transfer can be an adequate heat transfer mechanism for the aperture array.

Considering the limitations of the geometries involved, the only practical method of efficient heat transfer away from the aperture array is via convection. Conductive heat transfer will always occur to some extent in moving heat from the aperture array surface to a heat sink (e.g. coolant channels), but convective heat transfer should take over at some point. Laminar convective heat transfer may be insufficient, but a turbulent flow can absorb the heat input at a reasonable fluid-channel delta T of several tens of degrees. A two-phase (boiling) convective flow may also be used, but is much more complex and does not provide an advantage over turbulent convection.

Regular water is preferred as the coolant. Water is one of the best performing "conventional" fluid. It is easier to use that ammonia, which requires a high pressure system and more extensive safety measures. In the comparison with liquid metals, only Gallium performs better, but water at elevated temperatures can meet the performance of Gallium, if required, water has a much larger allowable flow speed range than Gallium, and the use of gallium introduces other complications such as solidification, cost, corrosivity, and diffusion.

The aperture array may be constructed as a monolithic cooling block, so that the aperture array is integrated with the cooling block as a single unit. The cooling channels, apertures and support structure may all be fabricated out of the same monolithic block of material. A big advantage of this design is that it allows for a curved aperture array upper surface (facing the charged particle source). This curvature provides a significant improvement in the collimator spherical aberration.

The first aperture array 6 may be constructed with a curved upper surface (e.g. a 3 mm bulge or domed portion 91) and with straight coolant channels 77a, resulting in varying distances between the coolant channels and the curved upper surface of the aperture array element. This geometry takes advantage of the spherical aberration improvement but results in larger and varying thermal path lengths from the beam areas to the coolant channels. In another embodiment, the cooling channels are curved similarly to the upper surface in the domed portion, to reduce variation in the thermal path lengths.

The aperture array is preferably made form a metallic material, in particular Copper, Molybdenum or Tungsten. Copper is preferred for its high thermal conductivity, and Molybdenum and Tungsten for their good thermal conductivity/expansion ratio.

The disc 90 and coolant channels 77a and can be fabricated using conventional methods. The curved upper surface can be fabricated using conventional techniques, depending on the required surface and shape tolerances. The apertures of the aperture array may be laser drilled or laser micromachining may be used. Oxford Lasers, for example supplies laser drilling systems and sub-contracting. In flat plates of silicon, copper, molybdenum, tungsten and other materials, the production of 100 micron diameter holes is feasible. Etching a curved surface is not preferred, due to the difficulties in resist spinning, lithographic exposure and etch depths. However, the very large number of holes to be drilled (e.g. around 100,000 apertures including blind holes in the non-aperture area) and drilling depths of 500 micron are additional considerations, requiring a long time to fabricate each array, and favouring the use of Tungsten.

Manufacturing the cooling channels using a drilling technique results in straight channels, and varying distances between the cooling channel and the curved upper surface of the aperture array element. The monolithic element may be fabricated using the so called 3D printing technique, enabling construction with the curved coolant channels. This permits the coolant channels to follow the curvature of the upper surface of the aperture array element, so that the thermal path length between the upper surface of the aperture array and the coolant channels to be made constant, resulting in more constant heat transfer to the coolant channels across the extent of the beam area of the aperture array element.

In operation when the aperture array becomes heated, large-scale z-direction deformation (i.e. in a direction parallel to the axis of the lithography column) is dominated by an axisymmetric bowing effect. The asymmetric nature of the deformation may be due to the radially varying temperature gradient in the curved array surface. A typical variation in z-deformation (over the center 40 mm diameter) is around 30 um for copper, 20 um for Molybdenum and 15 um for Tungsten.

Although this z-deformation is relatively high, a spherical shape of the aperture array upper surface is desirable in some configurations of the lithography column, and the spherical component of the surface shape can be subtracted from the deformation. Calculations for the aperture array of FIGS. 13-15 shows it can dissipate a 3400 W heat load while maintaining 3 micron flatness and an average temperature below 200C. Due to X-Y direction (i.e. perpendicular to the axis of the lithography column) deformation, some degree of pre-compensation of the aperture locations is desirable, i.e. locating the apertures in the aperture array so that during operation when the aperture array is heated, the deformation of the aperture array due to its temperature rise results in the apertures assuming their desired X-Y direction positions.

Two major advantages of the aperture array of FIGS. 13-15 is the monolithic design of the array and cooling structure. This is advantageous for the thermal behaviour and ensures a more consistent part quality, in terms of geometry and internal stresses. Other designs including a bond between materials of varying thermo-mechanical properties may give rise to unpredictable internal stresses during fabrication.

The invention has been described by reference to certain embodiments discussed above. It will be recognized that these embodiments are susceptible to various modifications and alternative forms well known to those of skill in the art without departing from the spirit and scope of the invention. Accordingly, although specific embodiments have been described, these are examples only and are not limiting upon the scope of the invention, which is defined in the accompanying claims.

The invention claimed is:

1. A charged particle lithography system for transferring a pattern onto the surface of a target, comprising:
a beam generator for generating a plurality of charged particle beamlets, the plurality of beamlets defining a column;
a plurality of aperture array elements comprising a first aperture array, a blanker array, a beam stop array, and a projection lens array;
wherein each aperture array element comprises a plurality of apertures arranged in a plurality of groups, the apertures for letting the beamlets pass through the aperture array element;
wherein the groups of apertures of each aperture array element form beam areas distinct and separate from a plurality of non-beam areas formed between the beam areas and containing no apertures for passage of the beamlets;
wherein the beam areas of the aperture array elements are aligned to form beam shafts, each comprising a plurality of beamlets, and the non-beam areas of the aperture array elements are aligned to form non-beam shafts not having beamlets present therein; and
wherein the first aperture array element is provided with cooling channels adapted for transmission of a cooling medium for cooling the first aperture array element, the cooling channels being provided in the non-beam areas of the first aperture array element.

2. The system of claim 1, wherein the first aperture array element comprises a plate having a thickness in a direction of the axis of the column and a width in a direction perpendicular to the axis of the column, wherein the apertures are formed through the thickness of the plate in the non-beam areas of the plate, and the cooling channels are formed internally in the non-beam areas of the plate and extend in a direction of the width of the plate.

3. The system of claim 1, wherein the first aperture array element comprises a plate having a thickness in a direction of the axis of the column and a width in a direction perpendicular to the axis of the column, wherein the apertures are formed through the thickness of the plate in the non-beam areas of the plate, and the cooling channels are formed in external elements attached to the plate in the non-beam areas and extending in a direction of the width of the plate, the cooling channels adapted for providing structural support for the first aperture array element.

4. The system of claim 1, wherein the cooling medium comprises water.

5. The system of claim 1, further comprising a coolant system for flowing the cooling medium through the cooling channels, the coolant system being adapted to produce turbulent flow of the cooling medium through the cooling channels.

6. The system of claim 1, wherein the first aperture array is made from a monolithic plate of material in which the apertures and cooling channels are formed.

7. The system of claim 1, wherein the first aperture array is made from a plate of Tungsten.

8. The system of claim 1, wherein the first aperture array is made from a plate of Copper or Molybdenum.

9. The system of claim 1, wherein the plurality of aperture array elements further comprise a current limiting aperture array and a condenser lens array, each comprising a plurality of apertures arranged in a plurality of groups, the apertures for letting the beamlets pass through the aperture array elements, and wherein the groups of apertures of each aperture array element form beam areas distinct and separate from a plurality of non-beam areas formed between the beam areas and containing no apertures for passage of the beamlets, and wherein the beam areas of the aperture array elements are aligned to form beam shafts, each comprising a plurality of beamlets, and the non-beam areas of the aperture array elements are aligned to form non-beam shafts not having beamlets present therein.

10. The system of claim 1, wherein the first aperture array element comprises an integral current limiting aperture array, the apertures of the first aperture array element having a narrowest portion recessed below the upper surface of the first aperture array element.

11. The system of claim 1, wherein the first aperture array element is provided with a curved upper surface facing towards the beam generator.

12. The system of claim 11, wherein the first aperture array element is subdivided into alternating aperture-free areas and aperture areas, each aperture area comprising a plurality of apertures, and wherein the curved upper surface encompasses a plurality of the aperture-free areas and aperture areas.

13. The system of claim 11, wherein the curved upper surface of the first aperture array element forms a raised dome-shaped area protruding above the upper surface towards the beam generator.

14. The system of claim 11, wherein the curved upper surface of the first aperture array element forms a dome-shaped depression in the upper surface area facing the beam generator.

15. The system of claim 11, wherein the system has an optical axis and the curved surface is shaped according to a cosine function centred around the optical axis.

16. The system of claim 11, wherein the circumference of the curved surface is substantially larger than the height of the curved surface.

17. An aperture array element adapted for use in a charged particle lithography system for generating a plurality of beamlets for transferring a pattern onto the surface of a target, the aperture array comprising a plurality of apertures arranged in a plurality of groups, the apertures for letting the beamlets pass through the aperture array element;
wherein the groups of apertures form beam areas distinct and separate from a plurality of non-beam areas formed between the beam areas and containing no apertures for passage of the beamlets; and
wherein the first aperture array element is provided with cooling channels adapted for transmission of a cooling medium for cooling the first aperture array element, the cooling channels being provided in the non-beam areas of the first aperture array element.

18. The aperture array element of claim 17, wherein the first aperture array element comprises a plate having a thickness and a width, wherein the apertures are formed through the thickness of the plate in the non-beam areas of the plate, and the cooling channels are formed internally in the non-beam areas of the plate and extend in a direction of the width of the plate.

19. The aperture array element of claim 17, wherein the first aperture array element comprises a plate having a thickness and a width, wherein the apertures are formed through the thickness of the plate in the non-beam areas of the plate, and the cooling channels are formed in external elements attached to the plate in the non-beam areas and extending in a direction of the width of the plate, the cooling channels adapted for providing structural support for the first aperture array element.

20. The aperture array element of claim 17, wherein the cooling medium comprises water.

21. The aperture array element of claim 17, further comprising a coolant system for flowing the cooling medium through the cooling channels, the coolant system being adapted to produce turbulent flow of the cooling medium through the cooling channels.

22. The aperture array element of claim 17, wherein the first aperture array is made from a monolithic plate of material in which the apertures and cooling channels are formed.

23. The aperture array element of claim 17, wherein the first aperture array is made from a plate of Tungsten.

24. The aperture array element of claim 17, wherein the first aperture array is made from a plate of Copper or Molybdenum.

25. The aperture array element of claim 17, wherein the first aperture array element comprises an integral current limiting aperture array, the apertures of the first aperture array element having a narrowest portion recessed below the upper surface of the first aperture array element.

26. The aperture array element of claim 17, wherein the aperture array element comprises a plate, the plate being provided with a curved upper surface facing towards a beam direction.

27. The aperture array element of claim 26, wherein the aperture array element is subdivided into alternating aperture-free areas and aperture areas, each aperture area comprising a plurality of apertures, and wherein the curved upper surface encompasses a plurality of the aperture-free areas and aperture areas.

28. The aperture array element of claim 26, wherein the curved upper surface of the aperture array forms a raised dome-shaped area protruding above the upper surface towards the charged particle source.

29. The aperture array element of claim 26, wherein the curved upper surface of the aperture array forms a dome-shaped depression in the upper surface area facing the charged particle source.

30. The aperture array element of claim 26, wherein the system has an optical axis and the curved surface is shaped according to a cosine function centred around the optical axis.

31. The aperture array element of claim 26, wherein the circumference of the curved surface is substantially larger than the height of the curved surface.

32. A charged particle beam generator, comprising:
a charged particle source adapted for generating a diverging charged particle beam;
a collimating system for refracting the diverging charged particle beam, the collimating system comprising a first electrode; and
an aperture array element according to claim 17, the aperture array element forming a second electrode;
wherein the system is adapted for creating an accelerating electric field between the first electrode and the second electrode.

* * * * *

UNITED STATES PATENT AND TRADEMARK OFFICE
CERTIFICATE OF CORRECTION

PATENT NO. : 8,558,196 B2
APPLICATION NO. : 13/295246
DATED : October 15, 2013
INVENTOR(S) : Marco Jan-Jaco Wieland et al.

It is certified that error appears in the above-identified patent and that said Letters Patent is hereby corrected as shown below:

IN THE SPECIFICATION:
    In column 2 line 9 and column 2 line 16 the wording "non-beam areas" is corrected into "beam areas".

IN THE CLAIMS:
    More specifically, the wording "non-beam areas" is corrected into "beam areas" in column 14 line 15, column 14 line 23, column 15 line 35 and column 15 line 42.

Signed and Sealed this
Tenth Day of February, 2015

Michelle K. Lee
*Deputy Director of the United States Patent and Trademark Office*